United States Patent
Ren et al.

(10) Patent No.: US 12,497,409 B2
(45) Date of Patent: Dec. 16, 2025

(54) CRYSTAL FORM OF GONADOTROPIN RELEASING HORMONE ANTAGONIST, PREPARATION METHOD THEREFOR, AND USE THEREOF

(71) Applicant: Shenzhen Rentai Pharmatech Ltd., Shenzhen (CN)

(72) Inventors: Guobin Ren, Shenzhen (CN); Weijie Ji, Shenzhen (CN); Dongxu Yi, Shenzhen (CN); Jiajun Huang, Shenzhen (CN)

(73) Assignee: SHENZHEN JINGTAI TECHNOLOGY CO., LTD., Guangdong (CN)

( * ) Notice: Subject to any disclaimer, the term of this patent is extended or adjusted under 35 U.S.C. 154(b) by 860 days.

(21) Appl. No.: 17/675,576

(22) Filed: Feb. 18, 2022

(65) Prior Publication Data
US 2022/0169658 A1    Jun. 2, 2022

Related U.S. Application Data

(63) Continuation of application No. PCT/CN2019/101754, filed on Aug. 21, 2019.

(51) Int. Cl.
| | |
|---|---|
| C07D 495/04 | (2006.01) |
| A61K 31/519 | (2006.01) |
| A61P 15/00 | (2006.01) |
| A61P 17/10 | (2006.01) |
| A61P 17/14 | (2006.01) |
| A61P 25/28 | (2006.01) |
| A61P 35/00 | (2006.01) |

(52) U.S. Cl.
CPC .......... *C07D 495/04* (2013.01); *A61K 31/519* (2013.01); *A61P 15/00* (2018.01); *A61P 17/10* (2018.01); *A61P 17/14* (2018.01); *A61P 25/28* (2018.01); *A61P 35/00* (2018.01); *C07B 2200/13* (2013.01)

(58) Field of Classification Search
CPC ........ C07D 495/04; A61P 17/01; A61P 25/28; A61P 17/14; A61P 15/00; A61P 35/00; A61K 31/519; C07B 2200/13
See application file for complete search history.

(56) References Cited

U.S. PATENT DOCUMENTS 10,464,945 B2   11/2019   Miwa
11,306,104 B2*   4/2022   Kantor .................... A61P 15/00
2006/0160829 A1   7/2006   Cho et al.
2019/0321363 A1*  10/2019   Peddireddy ............ A61K 9/143
2020/0140434 A1   5/2020   Jia et al.
2023/0374030 A1*  11/2023   Paschalides ......... C07D 495/04

FOREIGN PATENT DOCUMENTS

| CN | 100360538 C | 1/2008 |
| CN | 101153042 A | 4/2008 |
| CN | 104703992 A | 6/2015 |
| CN | 104703992 A1 | 6/2015 |
| WO | 2019020102 A1 | 1/2019 |
| WO | 2019178304 A1 | 9/2019 |

OTHER PUBLICATIONS

Chinese Office Action in reference to CN application No. 201980002268.X.
Kazuhiro Miwa et al., J. Med. Chem., vol. 54, pp. 4998-5012, Jun. 9, 2011.
International Search Report and Written Opinion mailed Mar. 31, 2020, in reference to co-pending Chinese Patent Application No. PCT/CN2019/101754 filed Aug. 21, 2019.
Miwa, et al., "Discovery of 1-{4-[1-(2, 6-Difluorobenzyl)-5-[dimethylamino)methyl]-3-(6-methoxypyridazin-3-yl)-2, 4-dioxo-1, 2, 3, 4-tetrahydrothieno[2, 3-d]pyrimidin-6-yl}-3-methoxyurea (TAK-385) as a Potent, Orally Active, Non-Peptide Antagonist of the Human Gonadotropin-Releasing Hormone Receptor", J. Med. Chem., vol. 54, pp. 4998-5012, Jun. 9, 2011.
Office Action pertaining to Application No. 201980002268 notified Jan. 27, 2022.

* cited by examiner

*Primary Examiner* — James H Alstrum-Acevedo
*Assistant Examiner* — Carolyn L. Ladd
(74) *Attorney, Agent, or Firm* — DINSMORE & SHOHL LLP (57) ABSTRACT

Provided are a crystal form of a gonadotropin releasing hormone antagonist, a preparation method therefor, and use thereof. A crystal form C and a crystal form D have high purity, good illumination stability, high temperature stability, and high humidity stability, and have good solubility and low hygroscopicity; the saturation solubility of the crystal form C and the crystal form D is 101.75 μg/ml and 87.21 μg/ml, respectively; when the relative humidity is increased from 0 to 50% RH, the hygroscopy gain of the crystal form C and the crystal form D is not greater than 1.76% and 0.73%, respectively; and when the relative humidity is increased from 0 to 90% RH, the hygroscopy gain of the crystal form C and the crystal form D is not greater than 3.43% and 1.61%, respectively. Therefore, the control of a production condition is facilitated, the preparation process is simple, the quality is stable, and large-scale industrial production is easy.

11 Claims, 10 Drawing Sheets

CRYSTAL FORM OF GONADOTROPIN RELEASING HORMONE ANTAGONIST, PREPARATION METHOD THEREFOR, AND USE THEREOF

CROSS-REFERENCE TO RELATED APPLICATIONS

This application is a continuation application of International Patent Application No. PCT/CN2019/101754 with an international filing date of Aug. 21, 2019, designating the United States, now pending. The contents of the aforementioned application are incorporated herein by reference.

TECHNICAL FIELD

The disclosure relates to the technical field of a drug crystal, and particularly relates to a crystal form of a gonadotropin releasing hormone antagonist and a preparation method therefor and use thereof.

BACKGROUD

Gonadotropin releasing hormone (GnRH) antagonists have excellent therapeutic effects on hormone-dependent cancers such as prostate cancer, endometriosis, and sexual precosity. However, the current gonadotropin releasing hormone antagonists under development are mostly peptide derivatives, most of which have an issue of poor oral absorption. These issues are associated with a dosage form, a dose volume, drug stability, sustained action and metabolic stability of the drugs, and are difficult to overcome. At present, it is urgently needed to develop novel oral GnRH antagonists, especially the gonadotropin releasing hormone antagonists based on a nonpeptide compound, which do not exhibit a transient pituitary-gonadotropic action (quick action) and have excellent oral absorption.

N-(4-(1-(2,6-difluorobenzyl)-5-((dimethylamino)methyl)-3-(6-methoxy-3-pyridazinyl)-2,4-dioxo-1,2,3,4-tetrahydrothieno[2,3-d]pyrimidin-6-yl)phenyl)-N'-methoxyurea, also known as Relugolix, is a gonadotropin releasing hormone (GnRH) antagonist developed by Takeda Pharmaceutical Industry Co., Ltd., and it is known that Relugolix has an excellent therapeutic effect on hormone-dependent cancers such as prostate cancer, endometriosis, and sexual precosity, and its structure is as shown in the following formula (I).

China National Intellectual Property Administration published a patent document CN100360538B of a compound Relugolix developed by Takeda Pharmaceutical Industry Co., Ltd., this patent document discloses a preparation method for the compound shown in the formula (I). The inventors prepared the compound shown in the formula (I) on the basis of the method disclosed in this patent document and obtained a white powder, which was a crystal by detection, and named as a crystal form A, in the process of a pharmaceutical research using the crystal form A, it is found that the crystal form A has a low solubility and high hygroscopicity, thus the crystal form A is not likely to be used as a pharmaceutical raw material, a strict management is required during use, and it is required to increase the amount of an adjuvant material to produce a corresponding drug product.

SUMMARY

Accordingly, the technical problem to be solved by the disclosure is to overcome the issue of poor solubility and being easily hygroscopic in the existing gonadotropin releasing hormone—Relugolix.

In order to achieve the above objective, the inventors conducted careful studies and found that N-(4-(1-(2,6-difluorobenzyl)-5-((dimethylamino)methyl)-3-(6-methoxy-3-pyridazinyl)-2,4-dioxo-1,2,3,4-tetrahydrothieno[2,3-d]pyrimidin-6-yl)phenyl)-N'-methoxyurea (a raw drug) prepared in Example 83 of the above patent document is a crystal, named as a crystal A. Then, by conducting intensive studies on this compound, the inventors found two new crystal forms of the gonadotropin releasing hormone antagonist, respectively named as a crystal form C and a crystal form D, the solvability of the crystal form C and the solvability of the crystal form D are significantly increased compared with that of the crystal form A, and have excellent stability and good hygroscopicity, thereby completing the present disclosure.

Particularly, the present disclosure relates to the following technical solution.

The disclosure provides a crystal form C of a gonadotropin releasing hormone antagonist, wherein an X-ray powder diffraction of the crystal form C using Cu—Kα radiation has characteristic peaks at 2θ angles of 5.6±0.2°, 7.8±0.2° and 10.8±0.2°.

Further, the X-ray powder diffraction of the crystal form C using Cu—Kα radiation also has a characteristic peak at 2θ angle of 6.8±0.2°.

Further, the X-ray powder diffraction of the crystal form C using Cu—Kα radiation also has characteristic peaks at 2θ angles of 17.4±0.2° and 19.1±0.2°.

Further, pattern data of the X-ray powder diffraction of the crystal form C are as follows:

| 2θ (±0.2°) | d (Å) | I % |
|---|---|---|
| 5.6 | 15.8 | 100 |
| 7.8 | 11.4 | 16.2 |
| 10.8 | 8.2 | 44.9 |

Further, pattern data of the X-ray powder diffraction of the crystal form C are as follows:

| 2θ (±0.2°) | d (Å) | I % |
|---|---|---|
| 5.6 | 15.8 | 100 |
| 7.8 | 11.4 | 16.2 |
| 10.8 | 8.2 | 44.9 |
| 17.4 | 5.1 | 13.4 |
| 19.1 | 4.6 | 10.4 |

Figure 7:
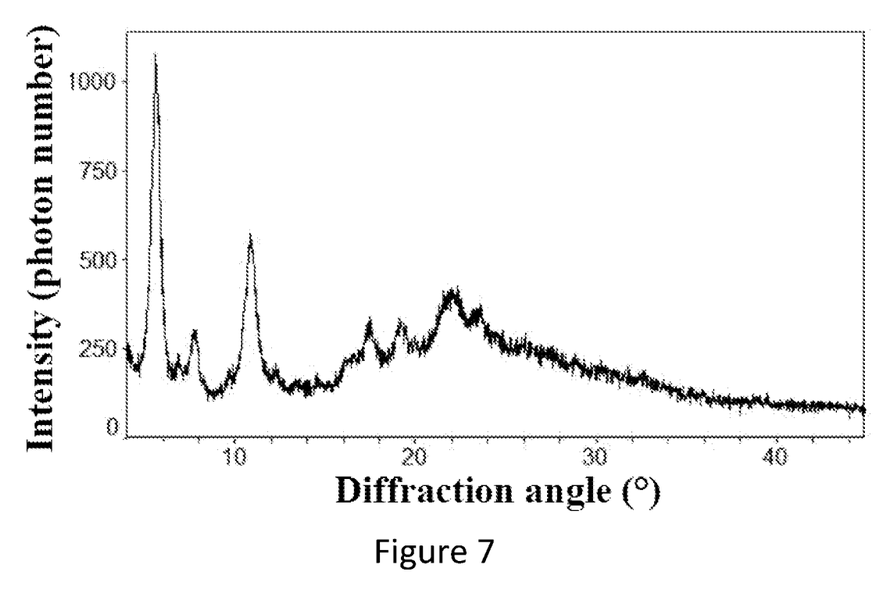
FIG. 7 is an XRPD pattern of a crystal form C in Experimental example 1 of the disclosure.

Further, the crystal form C has an X-ray powder diffraction pattern substantially as shown in FIG. 7.

Further, a differential scanning calorimetry curve of the crystal form C has two endothermic peaks, wherein a first endothermic peak is at a temperature of 90±2° C., and a second endothermic peak is at a temperature of 143±2° C.

Figure 8:
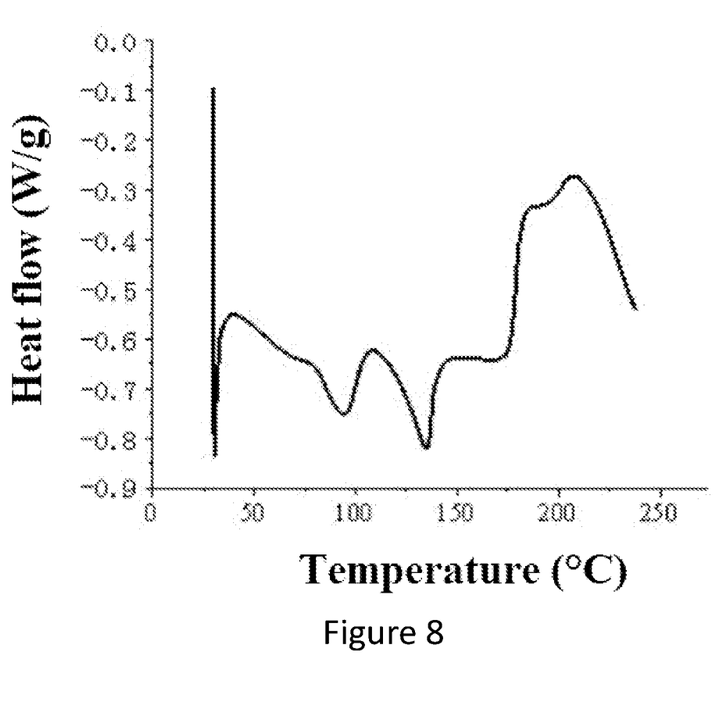
FIG. 8 is a differential scanning calorimetry (DSC) curve of the crystal form C in Example 1 of the disclosure.

Further, the crystal form C has a differential scanning calorimetry curve substantially as shown in FIG. 8.

Further, the crystal form C has a thermal weight loss of less than 2.07% before 100° C. in its thermo gravimetric analysis curve.

Figure 9:
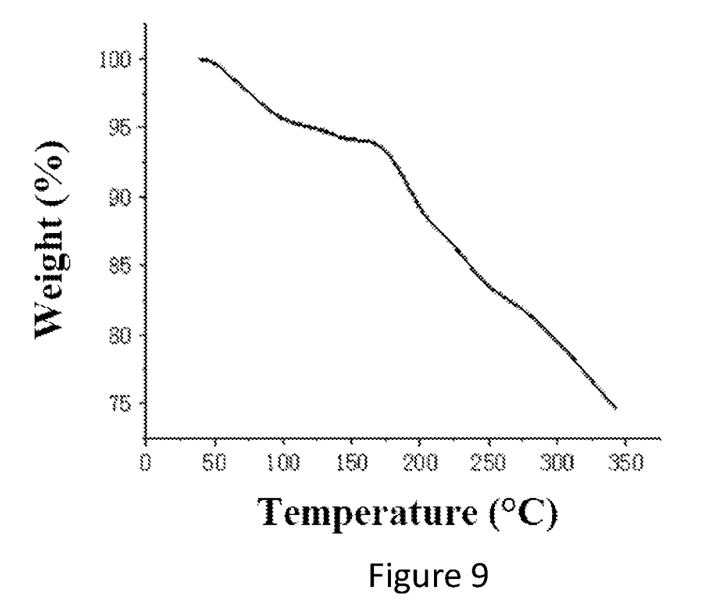
FIG. 9 is a thermo gravimetric analysis (TGA) curve of the crystal form C in Example 1 of the disclosure.

Further, the crystal form C a thermo gravimetric analysis curve substantially as shown in FIG. 9.

The present disclosure also provides a preparation method for any one of the above crystal forms C of the gonadotropin releasing hormone antagonist, including the following steps of: dissolving a raw drug of a compound of a formula (I) into dichloromethane, then adding water, precipitating a solid, and drying to obtain the crystal form C.

Further, said precipitating a solid includes firstly cooling to 8-12° C., then placing in an environment of −20° C. to −5° C. for 20-28 hours, and heating to room temperature.

Further, a ratio of a mass of the raw drug of the compound of the formula (I) to a volume of dichloromethane to a volume of water is (100-200 mg):(1-5 ml):(4-20 ml).

Further, an X-ray powder diffraction of the crystal form D using Cu—Kα radiation has characteristic peaks at 2θ angles of 6.7±0.2°, 7.5±0.2°, 12.8±0.2° and 19.6±0.2°.

Further, the X-ray powder diffraction of the crystal form D using Cu—Kα radiation also has characteristic peaks at 2θ angles of 8.4±0.2° and 9.9±0.2°.

Further, the X-ray powder diffraction of the crystal form D using Cu—Kα radiation also has characteristic peaks at 2θ angles of 13.4±0.2° and 10.4±0.2°.

Further, pattern data of the X-ray powder diffraction of the crystal form D are as follows:

| 2θ (±0.2°) | d (Å) | I % |
|---|---|---|
| 6.7 | 13.2 | 53.3 |
| 7.5 | 11.8 | 42.1 |
| 8.4 | 10.5 | 100 |
| 9.9 | 8.9 | 45.1 |
| 12.8 | 6.9 | 45.7 |
| 19.6 | 4.5 | 93.4 |

Further, pattern data of the X-ray powder diffraction of the crystal form D are as follows:

| 2θ (±0.2°) | d (Å) | I % |
|---|---|---|
| 6.67 | 13.2417 | 53.3 |
| 7.475 | 11.8163 | 42.1 |
| 8.391 | 10.5287 | 100 |
| 9.925 | 8.9043 | 45.1 |
| 10.425 | 8.4787 | 31.5 |
| 11.463 | 7.7129 | 19.6 |
| 12.799 | 6.9107 | 45.7 |
| 13.401 | 6.6017 | 19 |
| 19.647 | 4.5147 | 93.4 |
| 20.061 | 4.4224 | 18.7 |
| 24.717 | 3.5989 | 18.6 |
| 25.432 | 3.4994 | 25.8 |

Figure 10:
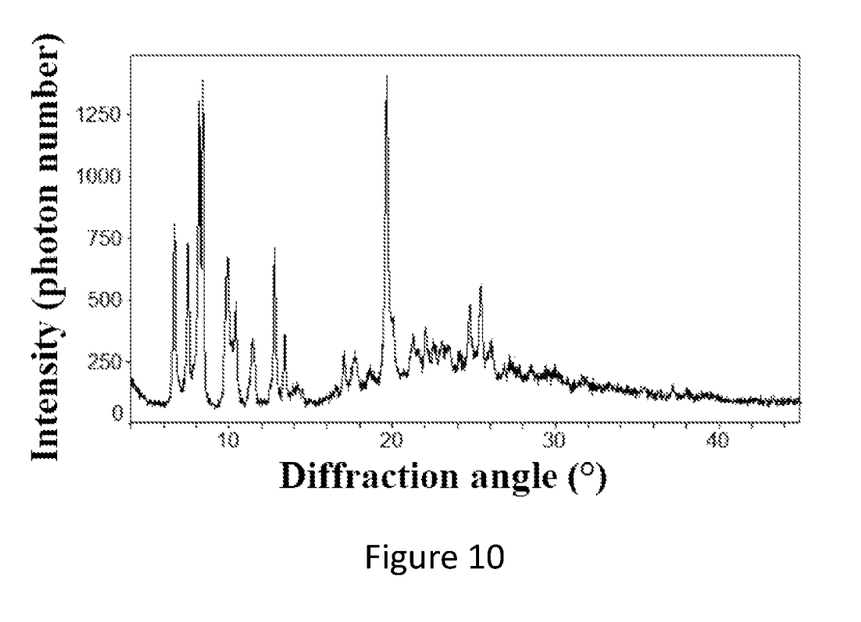
FIG. 10 is an XRPD pattern of a crystal form D in Example 2 of the disclosure.

Further, the crystal form D has an X-ray powder diffraction pattern substantially as shown in FIG. 10.

Further, a differential scanning calorimetry curve of the crystal form D has an absorption peak at 174±2° C.

Figure 11:
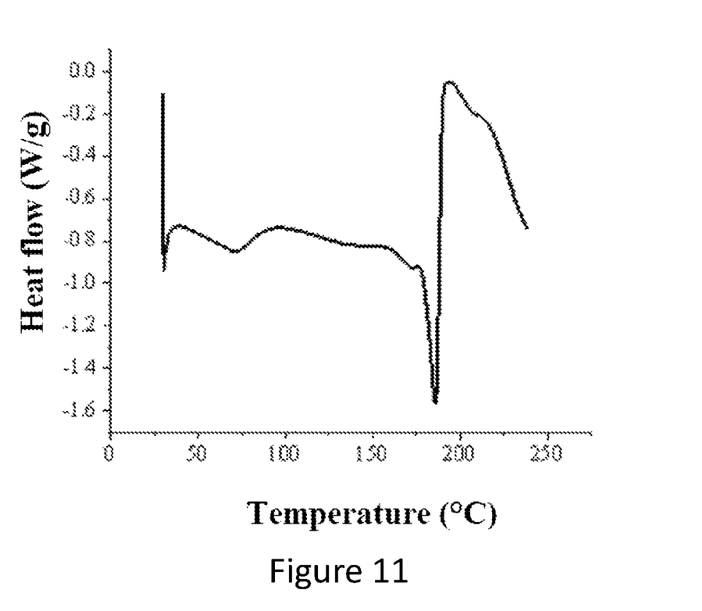
FIG. 11 is a DSC curve of the crystal form D in Example 2 of the disclosure.

Further, the crystal form D has a differential scanning calorimetry curve substantially as shown in FIG. 11.

Further, the crystal form D has a thermal weight loss of less than 0.08% before 100° C. in its thermo gravimetric analysis curve.

Figure 12:
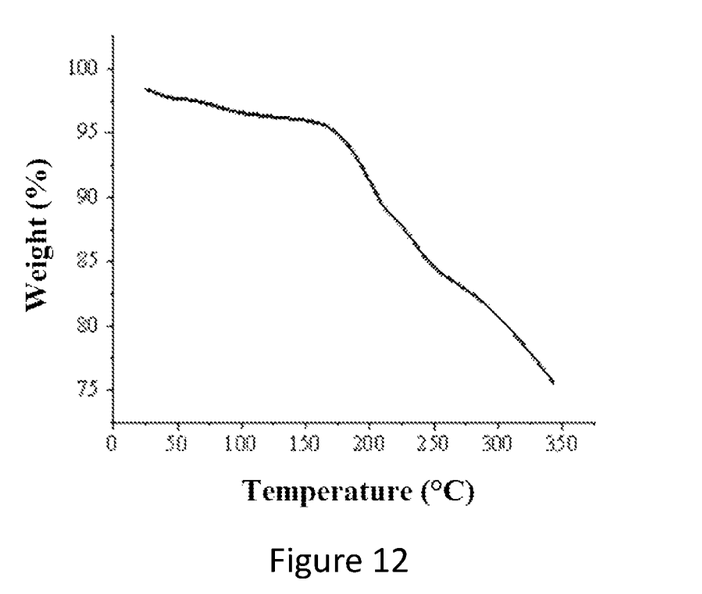
FIG. 12 is a TGA curve of the crystal form D in Example 2 of the disclosure.

Further, the crystal form D has a thermo gravimetric analysis curve substantially as shown in FIG. 12.

The disclosure also provides a preparation method for any one of the above crystal forms D of the gonadotropin releasing hormone antagonist, including the following steps of: dissolving a bulk drug of a compound of a formula (I) into dichloromethane, then adding diethyl ether, precipitating a solid, and drying to obtain the crystal form D.

Further, said precipitating a solid includes firstly cooling to 8-12° C., then placing in an environment of −20° C. to −5° C. for 20-28 hours, and heating to room temperature.

Further, a ratio of a mass of the raw drug of the compound of the formula (I) to a volume of dichloromethane to a volume of diethyl ether is (100-200 mg):(1-5 ml):(6-30 ml).

The present disclosure also provides a pharmaceutical composition, including any one of the above crystal forms C or any one of the above crystal forms D and a pharmaceutically acceptable excipient.

The present disclosure also provides use of a pharmaceutically effective amount of any one of the crystal forms C or any one of the crystal forms D, or the pharmaceutical composition in the manufacture of a medicament for preventing or treating sex hormone dependent cancer, bone metastasis of sex hormone dependent cancer, prostatauxe, uterus myoma, endometriosis, metrofibroma, sexual precosity, amenorrhoea, premenstral syndrome, dysmenorrhea, multilocular ovary syndrome, polycystic ovary syndrome, acne, alopecia, Alzheimer's disease, infertility, irritable bowel syndrome, hormone-independent and LH-RH sensitive benign or malignant tumor or flush; a reproductive regulator; a contraceptive; an ovulation inducer; or in the manufacture of a medicament for preventing postoperative recurrence of sex hormone dependent cancer.

The present disclosure also provides a method for preventing or treating sex hormone dependent cancer, bone metastasis of sex hormone dependent cancer, prostatauxe, uterus myoma, endometriosis, metrofibroma, sexual precosity, amenorrhoea, premenstral syndrome, dysmenorrhea, multilocular ovary syndrome, polycystic ovary syndrome, acne, alopecia, Alzheimer's disease, infertility, irritable bowel syndrome, hormone-independent and LH-RH sensitive benign or malignant tumor or flush; or preventing postoperative recurrence of sex hormone dependent cancer, including a step of administering a pharmaceutically effective dose of the pharmaceutical composition to a patient.

The technical solution of the present disclosure has the following advantages:

the crystal form C and the crystal form D of the gonadotropin releasing hormone antagonist (the compound of the formula (I)) provided by the present disclosure are of high purity, have good illumination stability, high temperature stability, and high humidity stability, and have good solubility and low hygroscopicity; the saturation solubility of the crystal form C and the crystal form D is 101.75 μg/ml and 87.21 μg/ml, respectively; when the relative humidity is increased from 0 to 50% RH, the hygroscopy gain of the crystal form C and the crystal form D is not greater than 1.76% and 0.73%, respectively; and when the relative humidity is increased from 0 to 90% RH, the hygroscopy gain of the crystal form C and the crystal form D is not greater than 3.43% and 1.61%, respectively. Therefore, the control of a production condition is facilitated, the preparation process is simple, the quality is stable, and large-scale industrial production is easy.

BRIEF DESCRIPTION OF THE DRAWINGS

In order to more clearly explain the specific embodiments of the present disclosure or the technical solution in the prior art, the accompanying drawings required for description of the specific embodiments or the prior art will be introduced briefly below. The accompanying drawings in the following description are some embodiments of the present disclosure, those skilled in the art can also obtain other accompanying drawings on the basis of these accompanying drawings, without paying a creative work.

DETAILED DESCRIPTION

In the description and claims of the present application, the compounds are all named according to the chemical structural formulas, in case of representing the same compound, if a name of the compound does not conform to a chemical structural formula, the compound is named based on the chemical structural formula or a chemical reaction formula.

In the present application, the scientific and technical terms as used herein have a meaning commonly understood by those skilled in the art, unless otherwise noted. However, in order to better understand the disclosure, definitions and explanations on partial related terms are provided below. In addition, when the definitions and explanations of the terms provided by the present application are not the meaning commonly understood by those skilled in the art, the meanings of the terms are based on the definitions and explanations of the terms provided by the present application.

X-ray powder diffraction (XRPD) means that when a beam of X-rays irradiates onto an object, the beam of X-rays is scattered by atoms in the object, every atom generates a scattered wave, and these waves interfere with each other, thus generating diffraction. Superposition of the diffraction waves results in increase of intensity of the rays in some directions, and decrease in other directions. A crystal structure may be obtained by analyzing the diffraction result. By using the diffraction principle, an X-ray diffractometer precisely determines the crystal structure, texture and stress of a substance, and precisely conducts phase analysis, qualitative analysis, and quantitative analysis. For a crystal material, when the crystal to be tested is at a different angle with an incoming beam, the crystal faces that meet Bragg diffraction will be detected, which is embodied in an XRPD pattern that it has diffraction peaks with different diffraction intensities. For a non-crystal material, because there is no long-range order for atomic arrangement in its crystal structure and there is only a short-range order within the range of several atoms, an XRPD pattern of the non-crystal material is some diffuse scattering broad peaks.

The "2θ angle" of the disclosure means that X-ray diffraction analysis is based on a Bragg formula (the Bragg formula is $2d \sin \theta = n\lambda$), in which "θ" refers to a grazing angle or Bragg angle, and is a complementary angle of an incidence angle, "2θ" refers to a diffraction angle; "d" refers to an interplanar spacing between two adjacent crystal faces in a crystal lattice, and its unit is angstrom (Å); "λ" refers to a wavelength of X-rays; "n" is any positive integer, and the X-ray diffraction is referred to as n-order diffraction correspondingly. In the XRPD pattern, the abscissa corresponding to the powder diffraction peak is the 2θ angle, and the error range of the 2θ angle at the peak position is ±0.3°, optionally ±0.2°. When the crystal form of the disclosure is determined by X diffraction, sometimes due to the instrument of detection or the condition of detection, the determined peak may have a slight test error, hence in case of determination of the crystal structure, this error should be taken into account, hence the applicant takes the error range (±0.2) into account when the 2θ angle is determined. "Substantially as shown in the figure" means that in the pattern at least 50%, or at least 60%, or at least 70%, or at least 80%, or at least 90%, or at least 99% of the peaks are shown in the figure.

Differential scanning calorimetry (DSC) is a thermoanalytical method. Under a program-controlled temperature, a relationship between difference in power input into a specimen and a reference compound (such as in the form of heat) and the temperature is determined. A curve recorded by a differential scanning calorimeter is called as a DSC curve, which uses a rate of heat adsorption or heat release of a sample, i.e. a heat flow rate dH/dt (unit: mJ/sec) or heat flow (unit: W/g) as the ordinate, and uses the temperature T or time t as the abscissa, and the DSC curve can be used to determine multiple thermodynamic and kinetic parameters, for example, specific heat capacity, reaction heat, transformation heat, phase diagram, reaction rate, crystallization rate, polymer crystallinity, sample purity, etc.

Thermogravimetric analysis (TGA) refers to a thermal analysis technique in which a relationship between the mass of a sample to be tested and the temperature change under a program-controlled temperature, and is used to study thermal stability and components of a substance. A thermogravimetry is used to determine the mass of substances as a function of temperature (or time) under a program-controlled temperature. During heating, when the tested substance is subjected to sublimation, vaporization, decomposition into gas or loss of crystal water, the mass of the tested substance will change. At this time, the thermogravimetric curve is not a straight line but declines to some extent. By analyzing the thermogravimetric curve, it can be known the degree at which the tested substance changes, and how much substance is lost can be calculated on the basis of weight loss, such as crystal water. TGA test contributes to the study on change in the properties of crystals, for example physical phenomena such as melting, evaporation, sublimation and adsorption; and also contributes to the study on chemical phenomena of a substance, such as dissociation, oxidation, reduction, thermal stability, decomposition process, quantitative analysis of ingredients, influence of additives and fillers, moisture and volatile matters, reaction kinetics, etc. Thermogravimetric analysis is generally divided into two types: dynamic (heating) and static (constant temperature). A curve obtained by the thermogravimetric test is referred to as a thermogravimetric curve (a TG curve), the TG curve uses mass as the ordinate, which may be also expressed in other forms such as weight loss percentage; and uses temperature (or time) as the abscissa, which represents increase of temperature (or time) from left to right.

Experimental Scheme

The following examples are provided to further better understand the present disclosure, but not limited to the best embodiments, and does not limit the content and protection scope of the present disclosure, and any products identical or similar to the disclosure obtained by any person under the inspiration of the disclosure or by combining the features of the disclosure with the features of other prior art all fall into the protection scope of the present disclosure.

Experimental Example 1 Solubility Test of a Crystal Form C and a Crystal Form D

Samples for test: a crystal form C and a crystal form D of a compound of a formula (I), their preparation methods being respectively shown in Example 1 and Example 2, a preparation method of the crystal form A of the compound of the formula (I) being shown in Comparative example 1.

Test method: the crystal form A, the crystal form C, and the crystal form D of the compound of the formula (I) were respectively taken, to measure their saturation solubility in water, a specific method was: a suitable amount of the samples for test were respectively taken, and put into a 10 mg sample bottle, 3 ml of a water solution was added, the solid was excess, and the obtained solution was placed at room temperature and stirred for 12 hours, and solubility in water was measured by using an HPLC method. The operation conditions of HPLC are as follows:

instrument: high performance liquid chromatograph (model: Thermo U3000)

chromatographic column: Agilent C18 column (5 μm, 150 mm×4.6 mm)

mobile phase composition and gradient elution program:

TABLE 5

| Gradient elution program table | | |
|---|---|---|
| Time (min) | 0.5% phosphoric acid water solution (%) | Acetonitrile (%) |
| 0 | 95 | 5 |
| 3 | 95 | 5 |
| 8 | 5 | 95 |
| 15 | 5 | 95 |

Detection wavelength: 254.4 nm;
flow rate: 1 ml/min;
sample size: 15 μL;
column temperature: 30° C.
The results are seen in Table 1.

TABLE 1

| Result table of saturation solubility | |
|---|---|
| Items | Saturation solubility |
| Crystal form A | 28.50 μg/ml |
| Crystal form C | 101.75 μg/ml |
| Crystal form D | 87.21 μg/ml |

In can be known from the above table that compared with that of the crystal form A, the saturation solubility of the crystal form C and the saturation solubility of the crystal form D are significantly improved.

Experimental Example 2 Hygroscopicity Test of the Crystal Form C and the Crystal Form D Samples of a crystal form A, a crystal form C, and a crystal form D of a compound of a formula (I) (respectively prepared in Comparative example 1, Example 1, Example 2) were respectively taken to conduct a water adsorption experiment, the experimental apparatus is DVS intrinsic from U.K. SMS company, the experimental conditions was: the temperature was 25° C., the relative humidity was changed stepwise by 10% humidity, and gradually increased from 0 to 90% RH, and the fixed equilibrium time for each humidity was 10 minutes. The results are shown in FIGS. 1-3.

Figure 1:
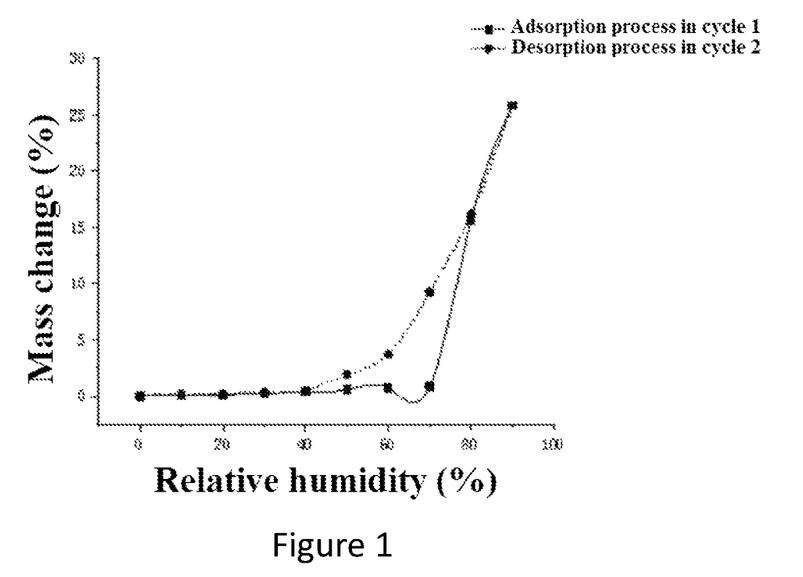
FIG. 1 is a dynamic vapor sorption (DVS) curve of a crystal form A in Experimental example 2 of the disclosure.

It can be seen from FIG. 1 that when the humidity is gradually increased from 0 to 50% RH, the moisture absorption of the crystal form A is 0.57%, and when the humidity is gradually increased from 0 to 90% RH, the hygroscopicity of the crystal form A is up to 25.84%.

Figure 2:
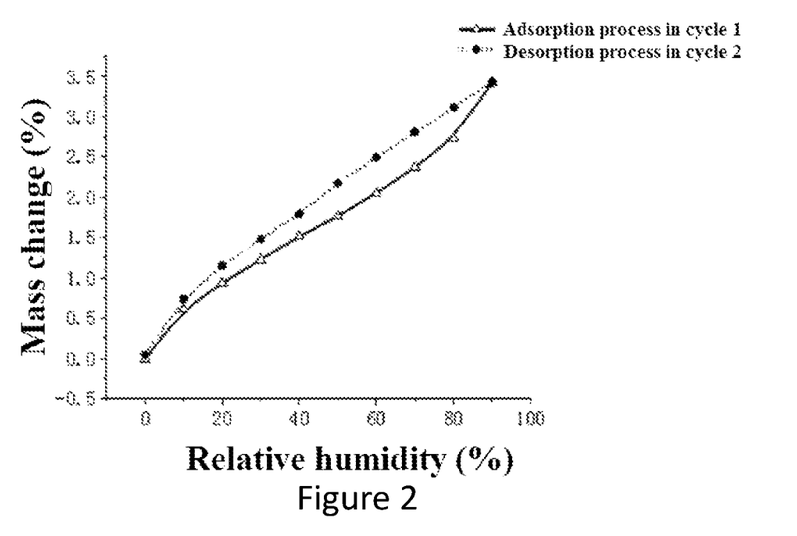
FIG. 2 is a DVS curve of a crystal form C in Experimental example 2 of the disclosure.
Figure 3:
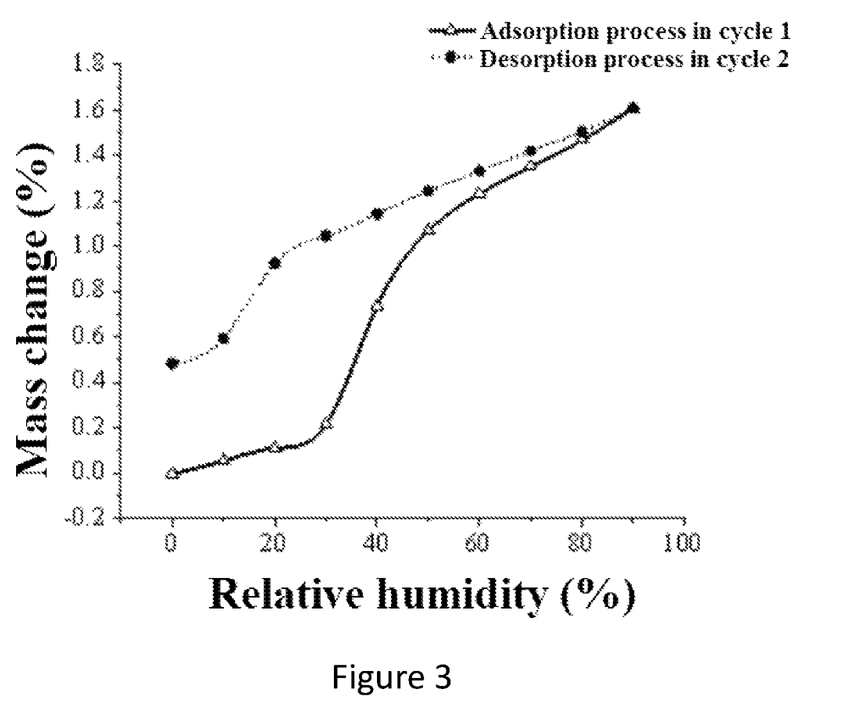
FIG. 3 is a DVS curve of a crystal form D in Experimental example 2 of the disclosure.

It can be seen from FIG. 2 that when the humidity is gradually increased from 0 to 50% RH, the moisture absorption is 1.76%, and when the humidity is gradually increased from 0 to 90% RH, the hygroscopicity of the crystal form C is 3.43%; it can be seen from FIG. 3 that when the humidity is gradually increased from 0 to 50% RH, the moisture absorption is 0.73%, and when the humidity is gradually increased from 0 to 90% RH, the hygroscopicity of the crystal form D is 1.61%.

This shows that compared with that of the crystal form A, the hygroscopicity of the crystal form C and the hygroscopicity of the crystal form D are significantly decreased, having good anti-moisture absorption, which contributes to transport and storage of drugs.

Experimental Example 3 Stability Test of the Crystal Form C and Crystal Form D

1. Experimental Method

Illumination stability: samples of the crystal form C and the crystal form D of the compound of the formula (I) (respectively prepared in Example 1 and Example 2) were respectively taken and placed at 25° C. under an illumination condition of 4500 Lux for 10 days, and samples were taken respectively on day 5 and day 10 at fixed time points to determine XRPD patterns of the crystal forms C and D and the content of N-(4-(1-(2,6-difluorobenzyl)-5-((dimethyl-amino)methyl)-3-(6-methoxy-3-pyridazinyl)-2,4-dioxo-1,2,3,4-tetrahydrothieno[2,3-d]pyrimidin-6-yl)phenyl)-N'-methoxyurea in the crystal forms C and D, which were compared with those of the samples on day 0.

High temperature stability: samples of the crystal form C and the crystal form D of the compound of the formula (I) (respectively prepared in Example 1 and Example 2) were respectively taken and placed at 60° C. for 10 days, and samples were taken respectively on day 5 and day 10 at fixed time points to determine XRPD patterns of the crystal forms C and D and the content of N-(4-(1-(2,6-difluorobenzyl)-5-((dimethylamino)methyl)-3-(6-methoxy-3-pyridazinyl)-2,4-dioxo-1,2,3,4-tetrahydrothieno[2,3-d]pyrimidin-6-yl)phenyl)-N'-methoxyurea in the crystal form C and the crystal form D, which were compared with those of the samples on day 0.

High humidity stability: samples of the crystal form C and the crystal form D of the compound of the formula (I) (respectively prepared in Example 1 and Example 2) were respectively taken and placed at 40° C. at 75% RH for 10 days, and samples were taken respectively on day 5 and day 10 at fixed time points to determine XRPD patterns of the crystal forms C and D and the content of N-(4-(1-(2,6-difluorobenzyl)-5-((dimethylamino)methyl)-3-(6-methoxy-3-pyridazinyl)-2,4-dioxo-1,2,3,4-tetrahydrothieno[2,3-d]pyrimidin-6-yl)phenyl)-N'-methoxyurea in the crystal form C and the crystal form D, which were compared with those of the samples on day 0.

A specific stability test method can refer to the method in appendix XI C of Part II of Chinese Pharmacopoeia (2015 edition); the purity detection adopts an HPLC method, and the purity can be determined by an external standard method with reference to the method in appendix VD of Chinese Pharmacopoeia (2015 edition) by using the samples on day 0 as a reference substance.

Operation Conditions of HPLC instrument: high performance liquid chromatograph (model: Thermo U3000)
chromatographic column: Agilent C18 column (5 μm, 150 mm×4.6 mm)
mobile phase composition and gradient elution program:

TABLE 2

Table of gradient elution program

| Time (min) | 0.5% phosphoric acid water solution (%) | Acetonitrile (%) |
|---|---|---|
| 0 | 95 | 5 |
| 3 | 95 | 5 |

TABLE 2-continued

Table of gradient elution program

| Time (min) | 0.5% phosphoric acid water solution (%) | Acetonitrile (%) |
|---|---|---|
| 8 | 5 | 95 |
| 15 | 5 | 95 | detection wavelength: 254.4 nm;
flow rate: 1 ml/min;
sample size: 15 μL;
column temperature: 30° C.

2. Experimental Results

Figure 4:
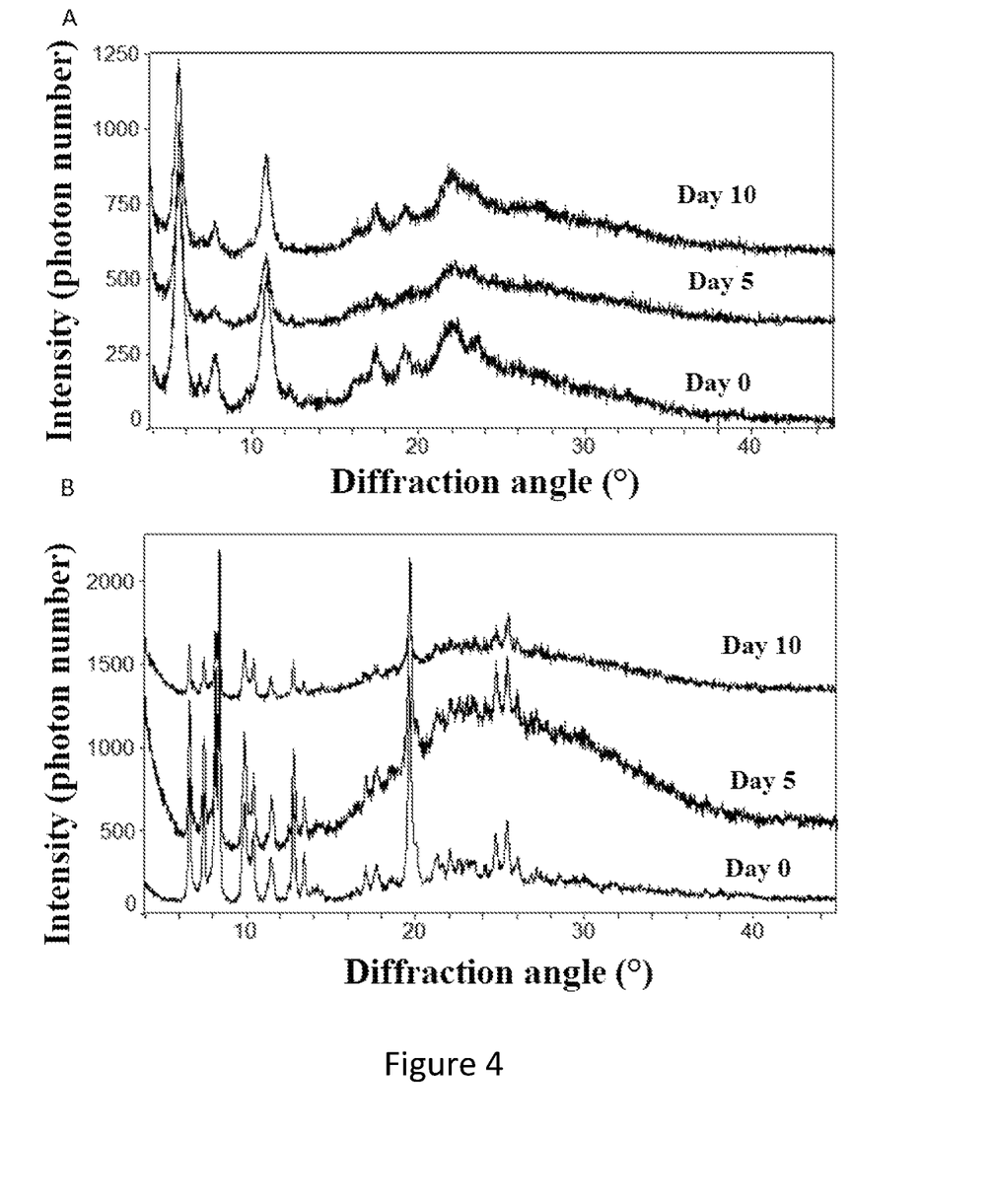
FIG. 4 is a comparative X-ray powder diffraction (XRPD) pattern showing illumination stability of a crystal form C and a crystal form D in Experimental example 3 of the disclosure; where, figure A is a comparative X-ray powder diffraction (XRPD) pattern showing illumination stability of the crystal form C, and figure B is a comparative X-ray powder diffraction (XRPD) pattern showing illumination stability of the crystal form D.
Figure 5:
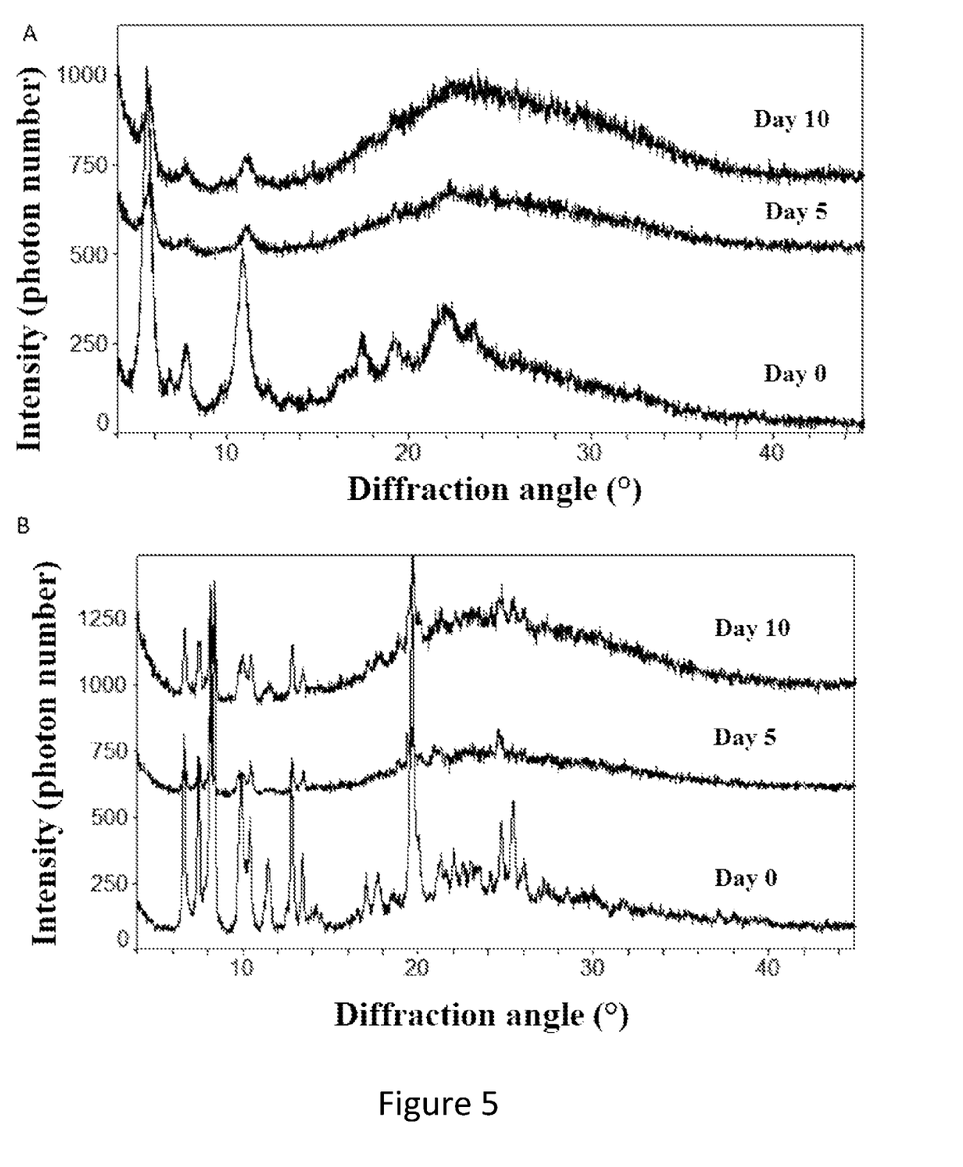
FIG. 5 is a comparative XRPD pattern showing high temperature stability of the crystal form C and the crystal form D in Experimental example 3 of the disclosure; where, figure A is a comparative XRPD pattern showing high temperature stability of the crystal form C, and figure B is a comparative XRPD pattern showing high temperature stability of the crystal form D.
Figure 6:
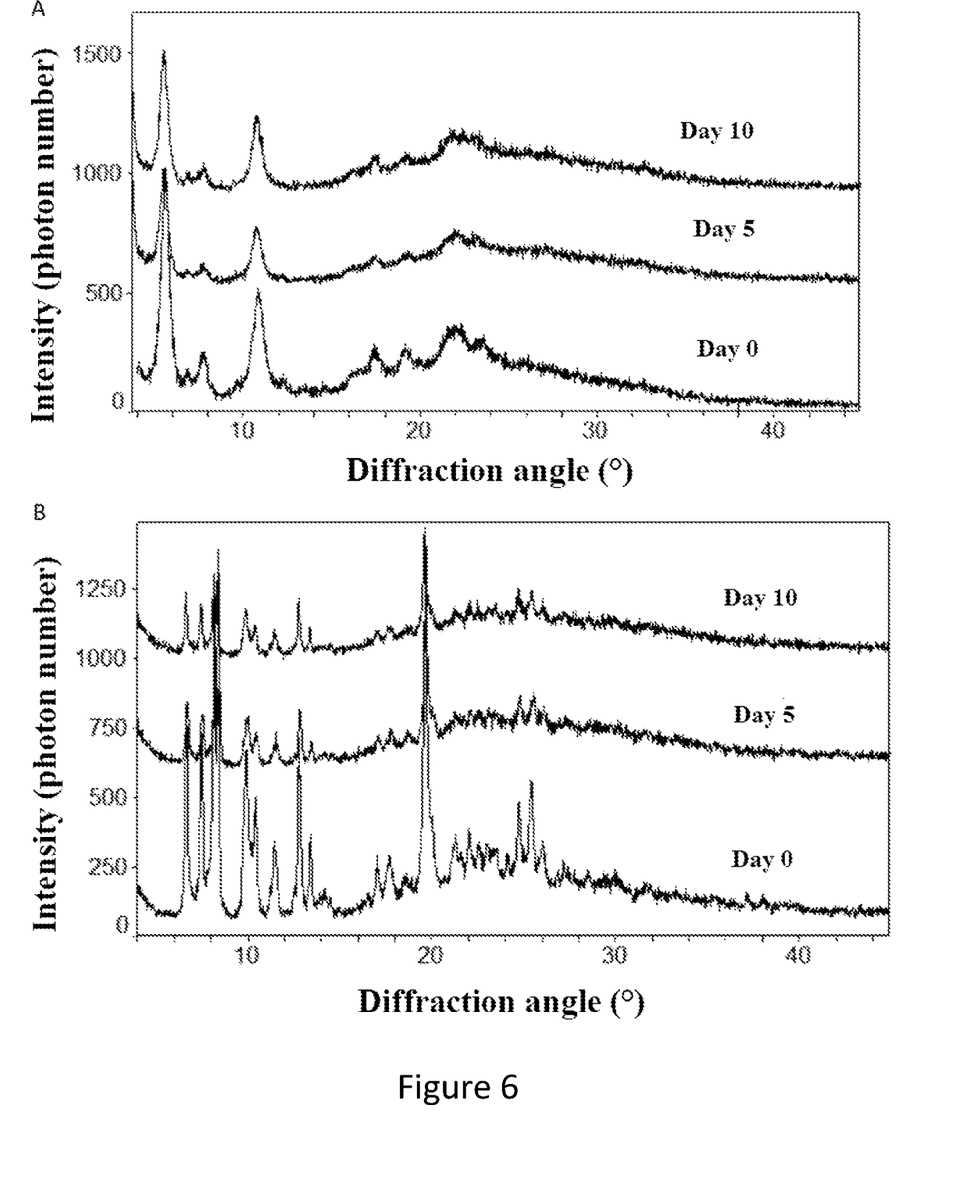
FIG. 6 is a comparative XRPD pattern showing high humidity stability of the crystal form C and the crystal form D in Experimental example 3 of the disclosure; where, figure A is a comparative XRPD pattern showing high humidity stability of the crystal form C, and figure B is a comparative XRPD pattern showing high humidity stability of the crystal form D.

It can be known from FIGS. 4-6 that the crystal form C and the crystal form D have a good stability under a condition of strong illumination (25° C., 4500 Lux), high temperature (60° C.), high humidity (25° C., 92.5% RH), and both have no crystal transformation.

It can be seen from the following tables that the purity change of the crystal form C and the crystal form D are both less than 5%, having an excellent stability.

TABLE 3

Stability test results of the crystal form C

| Conditions | Initial purity (day 0) | Purity on day 5 | Purity on day 10 | Purity change on day 10 |
|---|---|---|---|---|
| 25° C., 4500 Lux | 99.33% | 98.99% | 98.84% | 0.49% |
| 60° C. | | 97.89% | 96.75% | 2.58% |
| 40° C., 75% RH | | 96.88% | 96% | 3.33% |

TABLE 4

Stability test results of the crystal form D

| Conditions | Initial purity (day 0) | Purity on day 5 | Purity on day 10 | Purity change on day 10 |
|---|---|---|---|---|
| 25° C., 4500 Lux | 99.07% | 98.1% | 98.57% | 0.50% |
| 60° C. | | 96.25% | 96.51% | 2.56% |
| 40° C., 75% RH | | 97.88% | 97.21% | 1.86% |

In conclusion, the crystal form C and the crystal form D provided by the present application have good illumination stability, high temperature stability, high humidity stability, and compared with those of the crystal form A, the hygroscopicity and solubility were significantly improved.

Example 1 Preparation of the Crystal Form C 150 mg of a raw drug of a compound of a formula (I) was weighed and put in a sample bottle, 2 ml of dichloromethane was added to dissolve the raw drug, and 8 ml of water was added, so that a trace amount of solid was precipitated, the solution was cooled to 10° C., so that a great amount of gel-like solid were precipitated, then the resulting solution was placed in an environment of −15° C. for 24 hours, heated to room temperature, concentrated, filtered, and vacuum dried to obtain a yellowish solid, and XRPD test was performed on the yellowish solid, showing a crystal structure, named as a crystal form C. And structural characterization for the crystal form C was conducted respectively by differential scanning calorimetry (DSC), and thermogravimetric analysis (TGA).

(1) X-Ray Powder Diffraction (XRPD)

An X-ray powder diffraction was conducted by using the crystal form C, and the measurement conditions were as follows:

determination was performed by using Cu—Kα under a voltage of 40 KV, and a current of 40 mA at a test angle of 3-45°, a step length of 0.02°, and a light tube slit width of 1 mm by using a Dtex detector and a Bruker D8 DISCOVER type X-ray powder diffractometer.

An XRPD pattern of the above crystal form C is as shown in FIG. 7, and the X-ray powder diffraction of the crystal form C has characteristic peaks at 2θ angles of 5.6±0.2°, 7.8±0.2°, and 10.8±0.2°, also has a characteristic peak at 2θ angle of 6.8±0.2°, and also has characteristic peaks at 2θ angles of 17.4±0.2°, and 19.1±0.2°. The specific X-ray diffraction positions of the crystal form C are shown in Table 7.

TABLE 7

Result table for the X-ray diffraction of the crystal form C

| 2-Theta | d (Å) | I % |
|---|---|---|
| 5.576 | 15.8348 | 100 |
| 6.838 | 12.9164 | 5.8 |
| 7.751 | 11.396 | 16.2 |
| 10.826 | 8.1655 | 44.9 |
| 17.407 | 5.0905 | 13.4 |
| 19.13 | 4.6356 | 10.4 |

(2) DSC Determination

DSC determination was conducted by using the crystal form C, and the measurement conditions are as follows:

determination was performed by a TA250 differential scanning calorimeter from USA TA Instrument Company, with nitrogen protection and a heating rate of 10° C./min.

A DSC pattern of the crystal form C is as shown in FIG. 8, the crystal form C has two endothermic peaks, and a second endothermic peak arises from melting of the crystal form C. A first endothermic peak is at a temperature of 90° C., and the second endothermic peak is at a temperature of 143° C.

(3) TGA Detection

TGA detection was conducted by using the crystal form C, and the detection conditions were as follows:

determination was conducted by TA550 from USA TA Instrument Company, the detection conditions: a heating rate of 10° C./min.

A TGA pattern of the crystal form C is as shown in FIG. 9, and the crystal form C was desolvated by 2.07% at 100° C.

Example 2 Preparation of the Crystal Form D 150 mg of the raw drug of the compound of the formula (I) was weighed and put in a sample bottle, 2 ml of dichloromethane was added to dissolve the raw drug, and 12 ml of diethyl ether was added, so that a trace amount of solid was precipitated, the solution was cooled to 10° C., so that a great amount of gel-like solid was precipitated, then the resulting solution was placed in an environment of −15° C. for 24 hours, heated to room temperature, concentrated, filtered, and vacuum dried to obtain a yellowish solid, and XRPD test was performed on the yellowish solid, showing a crystal structure, named as a crystal form D. And structural characterization for the crystal form D was conducted by differential scanning calorimetry (DSC), and thermogravimetric analysis (TGA).

(1) X-Ray Powder Diffraction (XRPD)

X-ray powder diffraction was conducted by using the crystal form D, and the measurement conditions were as follows:

determination was performed by using Cu—Kα under a voltage of 40 KV, and a current of 40 mA at a test angle of 3-45°, a step length of 0.02°, and a light tube slit width of 1 mm by using a Dtex detector and a Bruker D8 DISCOVER type X-ray powder diffractometer.

An XRPD pattern of the above crystal form D is as shown in FIG. 10, and the X-ray powder diffraction of the crystal form D has characteristic peaks at 2θ angles of 6.7±0.2°, 7.5±0.2°, 12.8±0.2°, and 19.6±0.2°, also has characteristic peaks at 2θ angles of 8.4±0.2°, 9.9±0.2°, and 10.4±0.2°, and also has a characteristic peak at 2θ angle of 13.4±0.2°. Specific X-ray diffraction positions of the crystal form D are shown in Table 8.

TABLE 8

Result table for the X-ray diffraction of the crystal form D

| 2-Theta | d (Å) | I % |
|---|---|---|
| 6.67 | 13.2417 | 53.3 |
| 7.475 | 11.8163 | 42.1 |
| 8.391 | 10.5287 | 100 |
| 9.925 | 8.9043 | 45.1 |
| 10.425 | 8.4787 | 31.5 |
| 11.463 | 7.7129 | 19.6 |
| 12.799 | 6.9107 | 45.7 |
| 13.401 | 6.6017 | 19 |
| 14.179 | 6.2412 | 5.4 |
| 17.033 | 5.2011 | 11.4 |
| 17.71 | 5.004 | 11.7 |
| 18.612 | 4.7633 | 4.7 |
| 19.647 | 4.5147 | 93.4 |
| 20.061 | 4.4224 | 18.7 |
| 21.282 | 4.1714 | 10.5 |
| 22.039 | 4.0299 | 10.5 |
| 22.541 | 3.9413 | 6.5 |
| 23.003 | 3.8631 | 6.5 |
| 24.17 | 3.6792 | 4.9 |
| 24.717 | 3.5989 | 18.6 |
| 25.432 | 3.4994 | 25.8 |
| 26.047 | 3.4181 | 9.4 |
| 27.203 | 3.2754 | 5.6 |
| 28.491 | 3.1303 | 4.4 |

(2) DSC Determination

DSC determination was conducted by using the crystal form D, and the measurement conditions were as follows:

determination was performed by a TA250 differential scanning calorimeter from USA TA Instrument Company, with nitrogen protection, and a heating rate of 10° C./min.

A DSC pattern of the crystal form D is as shown in FIG. 11, and the crystal form D has an absorption peak at 174° C.

(3) TGA Detection

TGA detection was conducted by using the crystal form D, and the detection conditions were as follows:

determination was conducted by TA550 from USA TA Instrument Company, the test condition: a heating rate of 10° C./min.

A TGA pattern of the crystal form D is as shown in FIG. 12, and the crystal form D was desolvated by 0.08% at 100° C.

Comparative Example 1: Preparation of the Raw Drug

The raw drug of N-(4-(1-(2,6-difluorobenzyl)-5-((dimethylamino)methyl)-3-(6-methoxy-3-pyridazinyl)-2,4-dioxo-1,2,3,4-tetrahydrothieno[2,3-d]pyrimidin-6-yl)phenyl)-N'-methoxyurea (i.e., the raw drug of the compound of the formula (I)) was prepared according to the prior art, for example, according to the method disclosed in CN100360538B, the raw drug of N-(4-(1-(2,6-difluorobenzyl)-5-((dimethylamino)methyl)-3-(6-methoxy-3-pyridazinyl)-2,4-dioxo-1,2,3,4-tetrahydrothieno[2,3-d]pyrimidin-6-yl)phenyl)-N'-methoxyurea in this Comparative example was prepared by repeating the method disclosed in the prior art CN100360538B by Shanghai Haoyuan Biomedical Technology Co., Ltd, and X-ray powder diffraction was conducted by using the raw drug of the compound of the formula (I), and the measurement conditions were as follows:

determination was performed by using Cu—Kα under a voltage of 40 KV, and a current of 40 mA at a test angle of 3-45°, a step length of 0.02°, and a light tube slit width of 1 mm by using a Dtex detector and a Bruker D8 DISCOVER type X-ray powder diffractometer.

Figure 13:
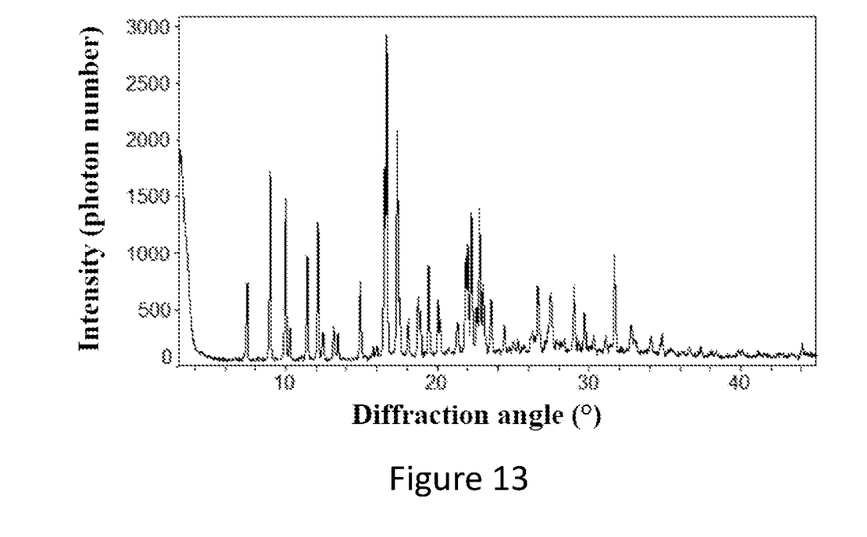
FIG. 13 is an XRPD pattern of a crystal form A in Comparative example 1 of the disclosure.

An XRPD diffraction pattern of the above raw drug of the compound of the formula (I) is as shown in FIG. 13, and it can be known from FIG. 13 that the raw drug of the compound of the formula (I) is a crystal, named as a crystal form A.

Specific X-ray diffraction positions of the crystal form A are shown in Table 9.

TABLE 9

Result table for the X-ray diffraction of the crystal form A

| 2-Theta | d (Å) | I % |
|---|---|---|
| 7.442 | 11.8695 | 24.1 |
| 8.986 | 9.8331 | 58.8 |
| 9.982 | 8.8541 | 50.8 |
| 10.28 | 8.5976 | 10 |
| 11.404 | 7.7527 | 32.7 |
| 12.136 | 7.2871 | 43 |
| 12.443 | 7.1079 | 8.6 |
| 13.176 | 6.7138 | 10.7 |
| 13.454 | 6.5759 | 8.3 |
| 14.913 | 5.9354 | 24.5 |
| 16.005 | 5.533 | 3.6 |
| 16.509 | 5.3651 | 59 |
| 16.651 | 5.3199 | 100 |
| 17.366 | 5.1024 | 69.7 |
| 18.08 | 4.9023 | 11 |
| 18.726 | 4.7347 | 18.4 |
| 19.425 | 4.566 | 27.7 |
| 20.044 | 4.4262 | 16.7 |
| 21.34 | 4.1602 | 9.5 |
| 21.999 | 4.0371 | 32.1 |
| 22.238 | 3.9942 | 42.9 |
| 22.582 | 3.9342 | 13.3 |

TABLE 9-continued

Result table for the X-ray diffraction of the crystal form A

| 2-Theta | d (Å) | I % |
|---|---|---|
| 22.795 | 3.8979 | 43.4 |
| 22.998 | 3.8639 | 20.1 |
| 23.534 | 3.7771 | 15.9 |
| 24.398 | 3.6453 | 8.2 |
| 25.047 | 3.5523 | 3.3 |
| 25.31 | 3.516 | 3.6 |
| 26.249 | 3.3923 | 5.8 |
| 26.612 | 3.3468 | 20 |
| 27.446 | 3.247 | 17 |
| 27.848 | 3.2011 | 3 |
| 28.159 | 3.1664 | 2.3 |
| 28.348 | 3.1457 | 3.3 |
| 29.019 | 3.0744 | 20.5 |
| 29.319 | 3.0436 | 2.9 |
| 29.683 | 3.0072 | 12.2 |
| 30.317 | 2.9457 | 5 |
| 31.111 | 2.8724 | 4.4 |
| 31.676 | 2.8224 | 30.5 |
| 32.754 | 2.7319 | 8.9 |
| 34.073 | 2.6291 | 5.7 |
| 34.806 | 2.5754 | 6.3 |

And structural characterization for the crystal form A was conducted by differential scanning calorimetry (DSC), and thermogravimetric analysis (TGA).

(2) DSC Determination

DSC determination was conducted by using the crystal form A, and the measurement conditions were as follows:

determination was performed by a TA250 differential scanning calorimeter from USA TA Instrument Company, with nitrogen protection, and a heating rate of 10° C./min.

Figure 14:
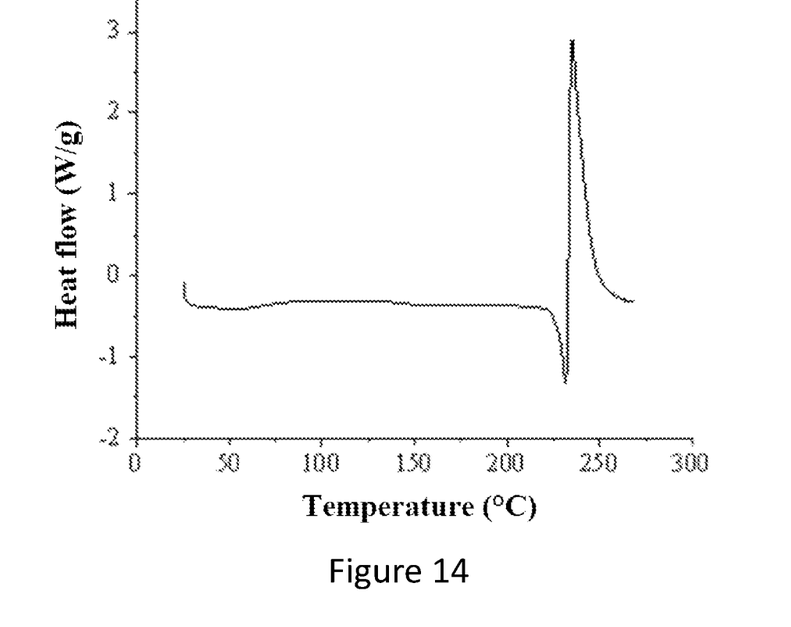
FIG. 14 is a DSC curve of the crystal form A in Comparative example 1 of the disclosure.

A DSC pattern of the crystal form A is as shown in FIG. 14, and the crystal form A has an absorption peak at 231° C.

(3) TGA Detection

TGA detection was conducted by using the crystal form A, and the detection conditions were as follows:

determination was conducted by TA550 from USA TA Instrument Company, the detection condition: a heating rate of 10° C./min.

Figure 15:
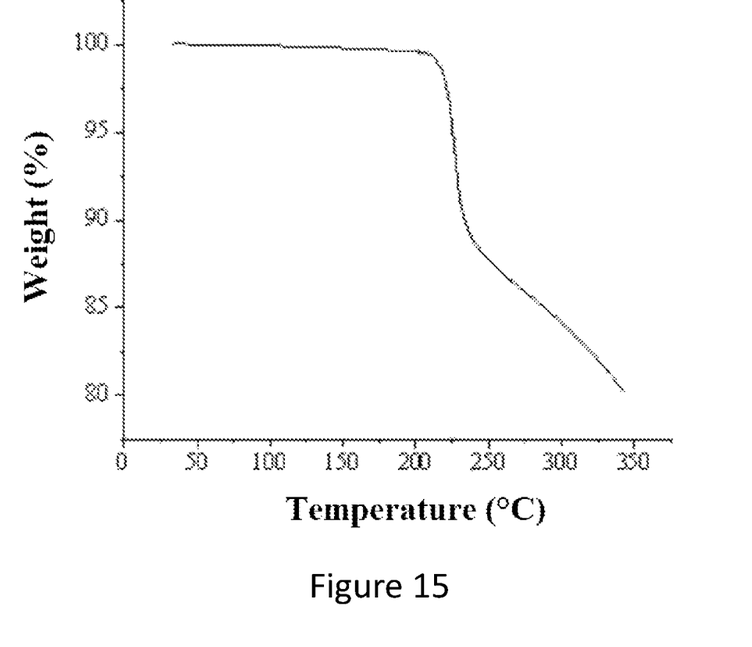
FIG. 15 is a TGA curve of the crystal form A in Comparative example 1 of the disclosure.

A TGA pattern of the crystal form A is as shown in FIG. 15, and the crystal form A was desolvated by 0.08% at 100° C.

Thee above-mentioned examples are only intended to clearly explain the disclosure, but not to restrict the embodiments. For those skilled in the art, other different forms of changes or variations can also be made on the basis of the above explanation. It is unnecessary and impossible to enumerate all the embodiments here. Obvious changes or variations derived therefrom are still within the protection scope of the disclosure.

What is claimed is:

1. A crystal form C of a gonadotropin releasing hormone antagonist, wherein an X-ray powder diffraction of the crystal form C using Cu—Kα radiation has characteristic peaks at 2θ angles of 5.6±0.2°, 7.8±0.2°, 10.8±0.2°, 17.4±0.2° and 19.1±0.2°, wherein the gonadotropin releasing hormone antagonist has the structure:

and wherein pattern data of the X-ray powder diffraction of the crystal form C is as follows:

| 2θ (±0.2°) | d (Å) | I % |
|---|---|---|
| 5.6 | 15.8 | 100 |
| 7.8 | 11.4 | 16.2 |
| 10.8 | 8.2 | 44.9 |
| 17.4 | 5.1 | 13.4 |
| 19.1 | 4.6 | 10.4. |

2. The crystal form C of the gonadotropin releasing hormone antagonist according to claim 1, wherein the X-ray powder diffraction of the crystal form C using Cu-Kα radiation also has a characteristic peak at 2θ angle of 6.8±0.2°.

3. The crystal form C of the gonadotropin releasing hormone antagonist according to claim 1, wherein a differential scanning calorimetry curve of the crystal form C has two endothermic peaks, wherein a first endothermic peak is at a temperature of 90±2° C., and a second endothermic peak is at a temperature of 143±2° C.

4. The crystal form C of the gonadotropin releasing hormone antagonist according to claim 1, wherein, the crystal form C has a differential scanning calorimetry curve substantially as shown in FIG. 8.

5. The crystal form C of the gonadotropin releasing hormone antagonist according to claim 1, wherein the crystal form C has a thermal weight loss of less than 2.07% before 100° C. in its thermo gravimetric analysis curve.

6. The crystal form C of the gonadotropin releasing hormone antagonist according to claim 1, wherein the crystal form C has a thermo gravimetric analysis curve substantially as shown in FIG. 9.

7. A pharmaceutical composition, comprising the crystal form C of the gonadotropin releasing hormone antagonist according to claim 1 and a pharmaceutically acceptable excipient.

8. A method for preparing the crystal form C of the gonadotropin releasing hormone antagonist according to claim 1, the method comprising: dissolving a raw drug of a compound according to formula (I) into dichloromethane, then adding water, precipitating a solid, and drying to obtain the crystal form C of the gonadotropin releasing hormone antagonist.

9. The method according to claim 8, wherein precipitating the solid comprises first cooling to 8-12° C., then placing in an environment of −20° C. to −5° C. for 20-28 hours, and then heating to room temperature.

10. The method according to claim 8, wherein a ratio of the mass of the raw drug of the compound according to formula (I) to the volume of dichloromethane to the volume of the water is (100-200 mg):(1-5 ml):(4-20 ml).

11. A method for treating endometriosis, metrofibroma, prostate cancer, or sexual precocity in a patient in need thereof, the method comprising administering to the patient a pharmaceutically effective dose of the crystal form C of the gonadotropin releasing hormone antagonist according to claim 1 or a pharmaceutical composition comprising the crystal form C of the gonadotropin releasing hormone antagonist.

* * * * *